US006750531B2

United States Patent
Takei et al.

(10) Patent No.: US 6,750,531 B2
(45) Date of Patent: Jun. 15, 2004

(54) SEMICONDUCTOR DEVICE HAVING POLYCRYSTALLINE SILICON FILM RESISTOR AND MANUFACTURING METHOD THEREFOR

(75) Inventors: Nobuo Takei, Chiba (JP); Toshihiko Omi, Chiba (JP); Keisuke Uemura, Chiba (JP)

(73) Assignee: Seiko Instruments Inc., Chiba (JP)

( * ) Notice: Subject to any disclaimer, the term of this patent is extended or adjusted under 35 U.S.C. 154(b) by 13 days.

(21) Appl. No.: 10/245,410

(22) Filed: Sep. 17, 2002

(65) Prior Publication Data
US 2003/0057519 A1 Mar. 27, 2003

(51) Int. Cl.[7] ............................................. H01L 29/00
(52) U.S. Cl. ......................................... 257/538; 257/536
(58) Field of Search ................................. 257/538, 536

(56) References Cited

U.S. PATENT DOCUMENTS 5,494,845 A * 2/1996 Sereda et al. ............... 438/384
6,475,400 B2 * 11/2002 Lammert ....................... 216/16

* cited by examiner

Primary Examiner—David Nelms
Assistant Examiner—Tu-tu Ho
(74) Attorney, Agent, or Firm—Adams & Wilks

(57) ABSTRACT

To provide a semiconductor device in which reduction of a variation in resistance value of a polycrystalline silicon film resistor is promoted. In a semiconductor device and a manufacturing method therefor according to the present invention, when the polycrystalline silicon film resistor is formed, a construction thereof is achieved by determining an implantation amount of an impurity implanted into the polycrystalline silicon film resistor through a novel technique to constitute a semiconductor integrated circuit device superior in performance.

4 Claims, 3 Drawing Sheets

SEMICONDUCTOR DEVICE HAVING POLYCRYSTALLINE SILICON FILM RESISTOR AND MANUFACTURING METHOD THEREFOR

BACKGROUND OF THE INVENTION

1. Field of the Invention

The present invention relates to a semiconductor device used for electronic equipment and particularly to a semiconductor device having a resistor and a manufacturing method therefor.

2. Description of the Related Art

Conventionally, a resistor made of a polycrystalline silicon film is manufactured by depositing the polycrystalline silicon film on a silicon substrate whose surface is oxidized or the like to form an insulating film, implanting in the polycrystalline silicon an impurity such as boron difluoride or phosphorous, and then etching the polycrystalline silicon into the phosphorous, and then etching the polycrystalline silicon into the resistor using a photoresist or the like as a mask. FIG. 3 is a plan view showing a polycrystalline silicon film resistor. An amount of the impurity implanted into a polycrystalline silicon film resistor 103 is determined by determining a length L 101 and a width W 102 thereof and then performing calculation using the length L 101 and the width W 102 of the polycrystalline silicon film resistor and a desired resistance value.

However, in recent years, high accuracy is required for the semiconductor device. The polycrystalline silicon film resistor manufactured by using a conventional manufacturing method involves a variation in resistance value, which prevents improvement in performance of the semiconductor device mounting the polycrystalline silicon film resistor therein, in particular, the semiconductor device for which absolute value accuracy of the resistor is required as in an A/D converter or the like.

SUMMARY OF THE INVENTION

The present invention has been made in view of the above-mentioned problem and an object of the present invention is to provide a semiconductor device capable of solving the above-mentioned problem, which includes a polycrystalline silicon film resistor having a reduced variation in resistance value with high accuracy, and to provide a manufacturing method therefor.

In order to achieve the above object, the present invention employs a means as described below.

The present invention employs a means for using an implantation amount of an impurity implanted into the polycrystalline silicon film resistor around the impurity implantation amount in which a sheet resistance value becomes minimum when manufacturing the polycrystalline silicon film resistor.

As a result of trial manufacturing of the present invention, as shown in FIG. 1, it is confirmed that the sheet resistance value of the polycrystalline silicon film resistor takes a minimum value with respect to a certain impurity implantation amount. The fact that there exists a minimum value of the sheet resistance value with respect to the impurity implantation amount means that even if the impurity implantation amount varies in the vicinity of the minimum value of the sheet resistance, the variation in sheet resistance value is kept small.

In the case where the impurity implantation amount is previously determined, in order to obtain a desired resistance value for the polycrystalline silicon film resistor, a relation may be utilized, which is expressed by the following equation:

$$R = \rho s \times L / W$$

where

R indicates the resistance value of the polycrystalline silicon film resistor, $\rho s$ indicates the sheet resistance value of the polycrystalline silicon film resistor, L indicates a length of the polycrystalline silicon film resistor, and W indicates a width of the polycrystalline silicon film resistor.

When the impurity implantation amount is determined, the sheet resistance value of the polycrystalline silicon film resistor is determined. Thus, L/W, that is, the length and the width of the polycrystalline silicon film resistor may be determined so as to obtain the desired resistance value of the polycrystalline silicon film resistor.

With the above-mentioned structure, the polycrystalline silicon film resistor with a small variation can be obtained.

DETAILED DESCRIPTION OF THE PREFERRED EMBODIMENT

Hereinafter, a description will be made of an embodiment of the present invention.

Embodiment 1 will be described with reference to FIG. 1.

Figure 1:
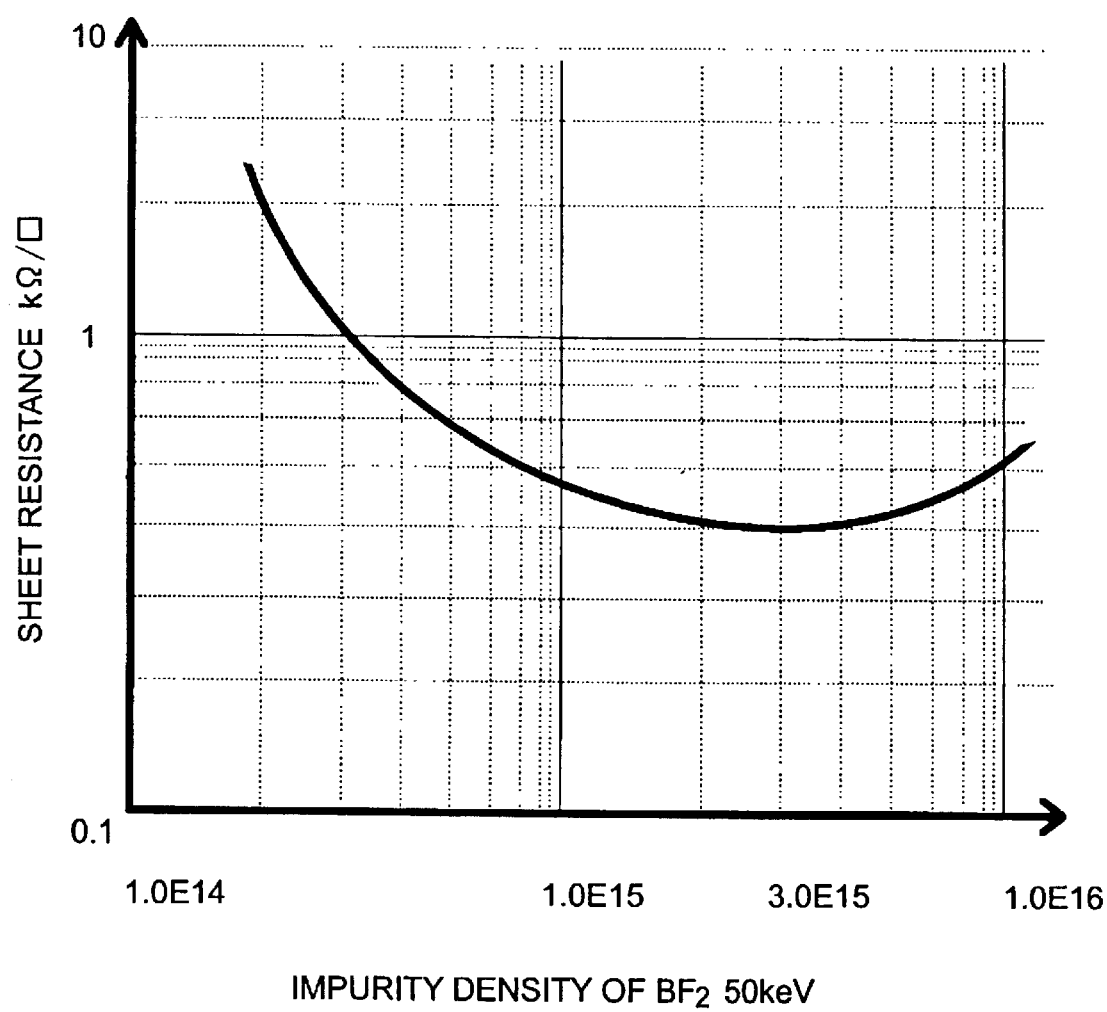
FIG. 1 is a graph showing the dependence of sheet resistance value on impurity implantation amount in a polycrystalline silicon film resistor.

FIG. 1 is a graph showing the results of trial manufacturing by the inventors of the present invention. The graph shows the dependence of sheet resistance value on impurity implantation amount when in a polycrystalline silicon film with a thickness of 1000 Å, boron difluoride is implanted through ion implantation at 50 KeV. When a dose amount of the boron difluoride is $3.0 \times 10^{15}$ cm$_{-2}$, the sheet resistance value takes 0.4 K$\Omega$/square as a minimum value. Thus, in the case where the boron difluoride is implanted through impurity implantation at 50 KeV to form the polycrystalline silicon film resistor, the impurity implantation amount of the boron difluoride is set to $3.0 \times 10^{15}$ cm$^{-2}$.

At this time, if the polycrystalline silicon film resistor of 1 K$\Omega$ is formed, since 1K=0.4 K×L/W, L/W is selected such that a ratio of L to W satisfies 5:2. For example, L/W is set to 20/8 or 40/16. The polycrystalline silicon film resistor is formed as in this embodiment, so that the polycrystalline silicon film resistor with a small variation in resistance value can be manufactured.

When the semiconductor device is manufactured on a silicon substrate, a plurality of identical semiconductor devices are formed on the same silicon substrate in many cases. In the case where the impurity implantation amount of the boron difluoride is set to $3.0 \times 10^{15}$ cm$^{-2}$, even if the impurity implantation amount of the boron difluoride supposedly varies in a range from $2.0 \times 10^{15}$ cm$^{-2}$ to $4.0 \times 10^{15}$ cm$^{-2}$, it is possible to suppress the variation in sheet resistance value of the polycrystalline silicon film resistor to about 10% or less.

Hereinafter, a description will be given of a manufacturing method when the polycrystalline silicon film resistor of 1KΩ is manufactured through ion implantation of the boron difluoride.

The manufacturing method for the polycrystalline silicon film resistor will be described using FIGS. 2A to 2E each corresponding to a section taken along the line 2—2 of FIG. 3.

Figure 2A:
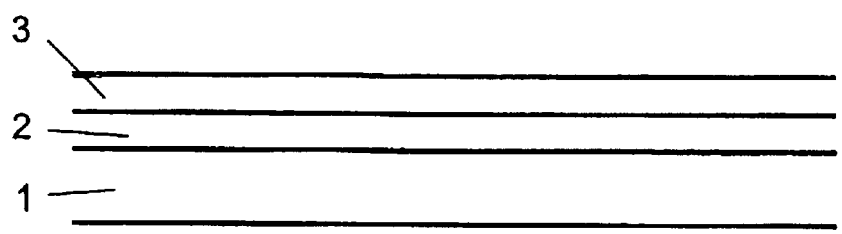
FIGS. 2A to 2E are schematic sectional views taken along the line 2—2 [A–A'] of FIG. 3, which show the steps of manufacturing the polycrystalline silicon film resistor according to one embodiment of the present invention.
Figure 3:
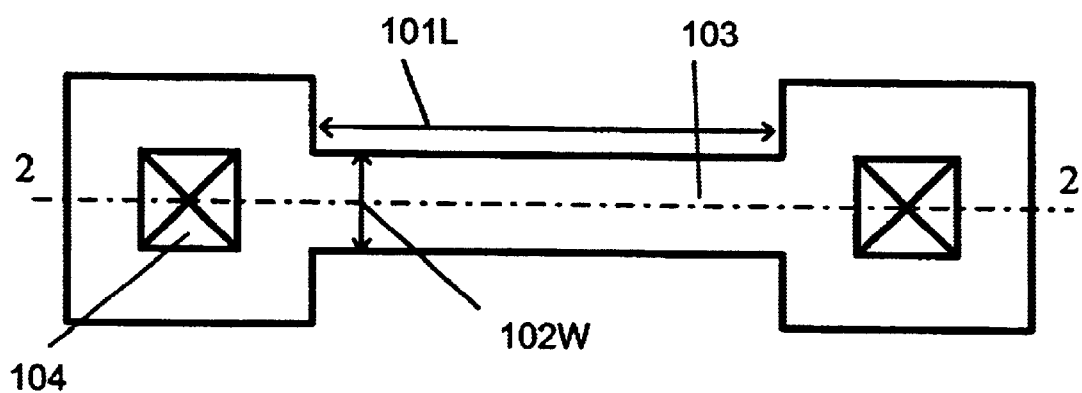
FIG. 3 is a plan view showing the polycrystalline silicon film resistor.

As shown in FIG. 2A, a surface of a silicon substrate 1 is oxidized to a depth of 8000 Å to form a silicon oxide film 2 and then a polycrystalline silicon film 3 is deposited thereon by about 0.1 μm.

Subsequently, in the polycrystalline silicon film 3, the boron difluoride is implanted at energy of 50 KeV in an implantation amount of $3.0 \times 10^{15}$ cm$^{-2}$ through ion implantation.

Figure 2B:
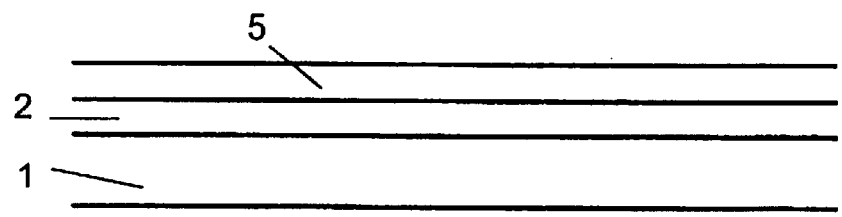

As shown in FIG. 2B, the polycrystalline silicon film 3 deposited on the substrate surface changes into a polycrystalline silicon film (after implantation of the boron difluoride) 5 having a sheet resistance value of 0.4 KΩ/square.

Figure 2C:
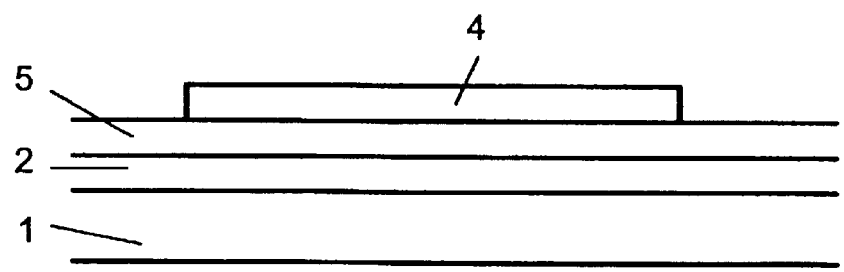

By using photolithography, a photoresist 4 is patterned into a resistor on the polycrystalline silicon film (after implantation of the boron difluoride) 5. FIG. 2C is a sectional view showing a state at this stage. At this time, patterning is performed such that a length L of a polycrystalline silicon film resistor 6 is 40 μm and a width W thereof is 16 μm.

Figure 2D:
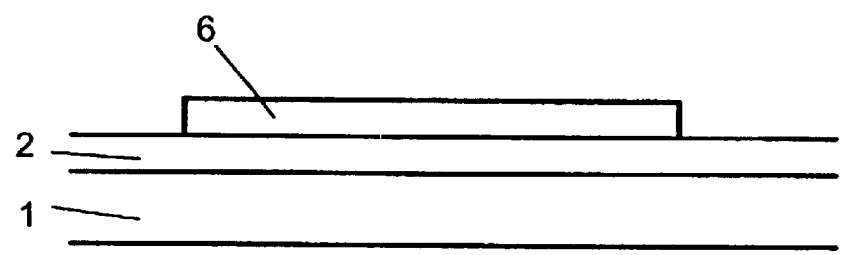

FIG. 2D shows a state in which etching is performed on the polycrystalline silicon film (after implantation of the boron difluoride) 5 and then the resist is peeled off.

Figure 2E:
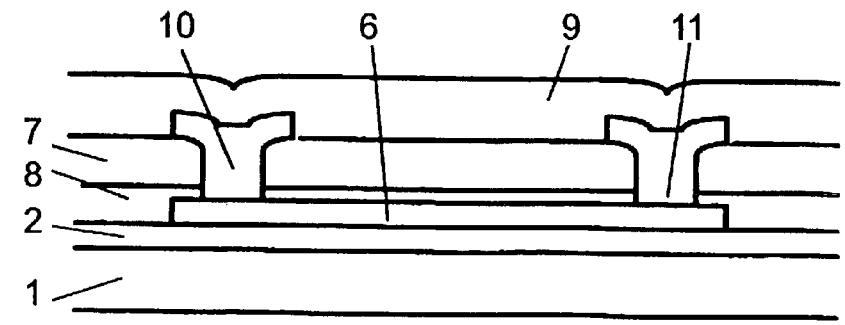

Thereafter, non-doped silicate glass 8 (hereinafter, referred to as an NSG film) with a thickness of 0.3 μm and boronphosphosilicate glass 7 (hereinafter, referred to as a BPSG film) with a thickness of 0.5 μm are deposited, followed by annealing at 900° C. and forming a contact portion 11 for leading out an electrode through etching. As metal used for a wiring, Ti, TiN, and Al—Si—Cu are deposited with a thickness of 0.05 μm, 0.15 μm, and 0.9 μm, respectively. Then, patterning is performed to form the wiring. A plasma nitride film 9 is deposited with a thickness of 1 μm as a protective film, followed by a step of forming a pad portion for leading out the electrode through etching to thereby complete the polycrystalline silicon film resistor. FIG. 2E is a sectional view taken along the line 2—2 of FIG. 3 at the time of completion.

According to the present invention, when the polycrystalline silicon film resistor is manufactured, it is possible to suppress to a minimum value the variation in sheet resistance value thereof caused by a variation in impurity implantation amount. The variation in sheet resistance value of the polycrystalline silicon film resistor is suppressed to a minimum value, whereby the semiconductor device mounting the resistor with high accuracy can be provided.

What is claimed is:

1. A semiconductor device comprising: a polycrystalline silicon film resistor formed by implanting an impurity into a polycrystalline silicon film deposited on a semiconductor substrate, wherein the polycrystalline silicon film resistor has a concentration of the implanted impurity in an amount set in proximity to an impurity implantation amount in which a sheet resistance value becomes minimum.

2. A manufacturing method for a semiconductor device having a polycrystalline silicon film resistor formed by implanting an impurity into a polycrystalline silicon film deposited on a semiconductor substrate, comprising a step of implanting the impurity in the polycrystalline silicon film resistor in an amount set in proximity to a impurity implantation amount in which a sheet resistance value becomes minimum.

3. A semiconductor device according to claim 1; wherein the polycrystalline silicon film resistor has a length and a width of the resistor so as to obtain a desired resistance value.

4. A manufacturing method for a semiconductor device according to claim 2; further comprising a step of forming the polycrystalline silicon film resistor with a length and a width of the resistor so as to obtain a desired resistance.

* * * * *